(12) United States Patent
Vivari, Jr.

(10) Patent No.: US 9,073,153 B2
(45) Date of Patent: Jul. 7, 2015

(54) FLUX AND SOLDER MATERIAL AND METHOD OF MAKING SAME

(75) Inventor: John A. Vivari, Jr., Greenville, RI (US)

(73) Assignee: Nordson Corporation, Westlake, OH (US)

( * ) Notice: Subject to any disclaimer, the term of this patent is extended or adjusted under 35 U.S.C. 154(b) by 307 days.

(21) Appl. No.: 13/015,167

(22) Filed: Jan. 27, 2011

(65) Prior Publication Data

US 2011/0195267 A1   Aug. 11, 2011

Related U.S. Application Data

(60) Provisional application No. 61/302,721, filed on Feb. 9, 2010.

(51) Int. Cl.

| | | |
|---|---|---|
| B32B 1/08 | (2006.01) | |
| B32B 15/01 | (2006.01) | |
| B32B 15/02 | (2006.01) | |
| B23K 35/34 | (2006.01) | |
| B23K 31/02 | (2006.01) | |
| B23K 35/36 | (2006.01) | |
| B23K 35/02 | (2006.01) | |
| B23K 35/362 | (2006.01) | |

(Continued)

(52) U.S. Cl.
CPC ....... *B23K 35/3613* (2013.01); *Y10T 428/2951* (2015.01); *Y10T 428/12493* (2015.01); *Y10T 428/12292* (2015.01); *B23K 35/0244* (2013.01); *B23K 35/025* (2013.01); *B23K 35/36* (2013.01); *B23K 35/3618* (2013.01); *B23K 35/362* (2013.01); *B23K 35/368* (2013.01); *B23K 35/40* (2013.01); *B32B 15/01* (2013.01); *B32B 15/02* (2013.01); *B32B 15/04* (2013.01); *H05K 3/3489* (2013.01)

(58) Field of Classification Search
None
See application file for complete search history.

(56) References Cited

U.S. PATENT DOCUMENTS 2,323,118 A * 6/1943 Caplan .......................... 524/77
4,143,005 A   3/1979 Packer
(Continued)

FOREIGN PATENT DOCUMENTS

EP   0183705 A1   6/1986
GB   2380964 A    4/2003
(Continued)

OTHER PUBLICATIONS

Altera Corporation, Reflow Soldering Guidelines for Surface-Mount Devices, Application Note 81 (AN 81), Jun. 2002, ver. 4, pp. 1-10.
(Continued)

*Primary Examiner* — Vera Katz
(74) *Attorney, Agent, or Firm* — Wood, Herron & Evans, LLP

(57) ABSTRACT

A flux for use in soldering comprises a primary solids constituent present in an amount greater than about 50 wt. % and one or more secondary constituents that is selected from solvents, thickeners, and/or metal oxide reducing agents. The flux has a temperature profile in which the flux is in a non-flowable inactive state at temperatures at and below a maximum storage temperature that is above about 27° C., a liquid active state at an activation temperature, and a flowable inactive state in a deposition temperature range above the maximum storage temperature and below the activation temperature. A solder material comprises solder particles dispersed in the flux.

21 Claims, 1 Drawing Sheet

(51) Int. Cl.
*B23K 35/368* (2006.01)
*B23K 35/40* (2006.01)
*B32B 15/04* (2006.01)
*H05K 3/34* (2006.01)

(56) References Cited

U.S. PATENT DOCUMENTS

| | | | |
|---|---|---|---|
| 4,194,931 A | | 3/1980 | Zado |
| 4,342,606 A | | 8/1982 | Notton |
| 4,429,457 A | * | 2/1984 | Noguchi et al. ............... 29/840 |
| 4,493,738 A | | 1/1985 | Collier et al. |
| 4,495,007 A | * | 1/1985 | Zado .............................. 148/23 |
| 4,523,712 A | | 6/1985 | Zado |
| 5,098,010 A | | 3/1992 | Carmichael et al. |
| 5,435,462 A | | 7/1995 | Fujii |
| 5,863,355 A | | 1/1999 | Ohno et al. |
| 6,592,020 B1 | * | 7/2003 | Currie et al. .................. 228/224 |
| 7,569,164 B2 | | 8/2009 | Sakurai et al. |
| 7,575,150 B2 | | 8/2009 | Saito et al. |
| 7,604,154 B2 | | 10/2009 | Matsumoto et al. |
| 2004/0026484 A1 | | 2/2004 | Yamashita et al. |
| 2005/0187212 A1 | * | 8/2005 | Ohki et al. ................. 514/226.5 |
| 2008/0073000 A1 | | 3/2008 | Ikeda et al. |
| 2010/0112250 A1 | * | 5/2010 | Shelby et al. ................ 428/35.7 |
| 2010/0112251 A1 | * | 5/2010 | Shelby et al. ................ 428/35.7 |
| 2011/0311832 A1 | * | 12/2011 | Vivari, Jr. ..................... 428/457 |

FOREIGN PATENT DOCUMENTS

| | | |
|---|---|---|
| JP | 1284495 | 11/1989 |
| WO | 8002663 A1 | 12/1980 |

OTHER PUBLICATIONS

European Patent Office, European Search Report in Application No. 11153873.2-1215, dated Jun. 20, 2011.
European Patent Office, extended Search Report in European Patent Application No. 12179468, dated Nov. 13, 2012.
Chinese Patent Office, Office Action in Chinese Patent Application No. 201110035989.6, dated Mar. 4, 2014.
European Patent Office, Office Action in EP11153873.2 dated Mar. 10, 2014.
Japanese Patent Office, Office Action in Japanese Patent Application No. 2011-025004, date dispatched Dec. 22, 2014.
Chinese Patent Office, Office Action in Chinese Patent Application No. 201110035989.6 dated Jan. 12, 2015.
JP H01-284495 (English translation), published by the Japanese Patent Office on Nov. 15, 1989.

* cited by examiner

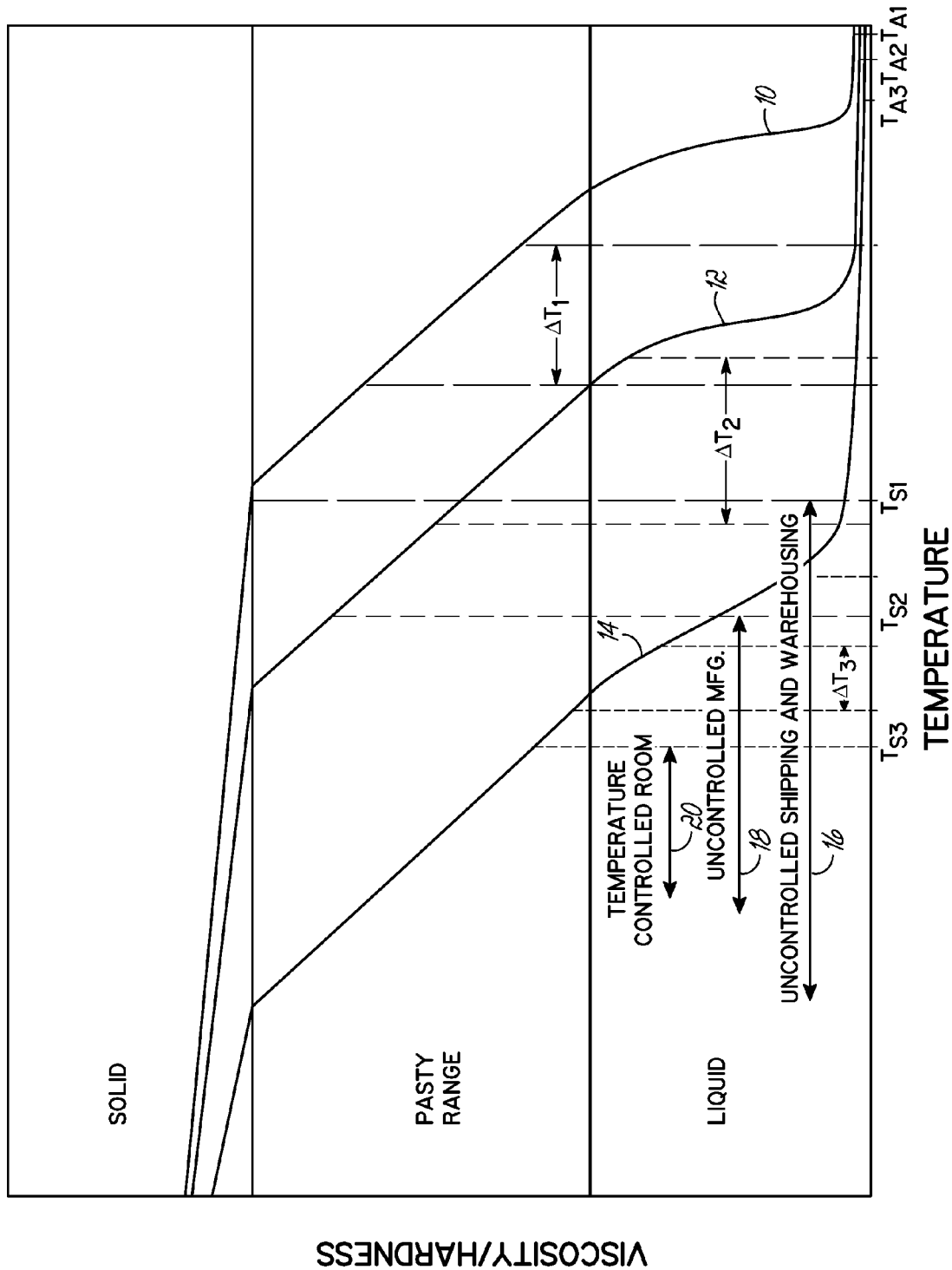

FLUX AND SOLDER MATERIAL AND METHOD OF MAKING SAME

CROSS-REFERENCE TO RELATED APPLICATION

This application claims the benefit of the filing date of U.S. Patent Application Ser. No. 61/302,721, entitled "FLUX AND SOLDER MATERIAL AND METHOD OF MAKING SAME" filed on Feb. 9, 2010, the disclosure of which is incorporated by reference herein in its entirety.

FIELD OF THE INVENTION

This invention generally relates to solder fluxes and solder materials and, more particularly, to solder fluxes and solder materials having a predetermined temperature-viscosity relationship.

BACKGROUND OF THE INVENTION

During a soldering process, two or more parts are joined to one another with a solder. As is known in the art, and by definition, solder is an alloy or filler metal having a liquidus temperature not exceeding 450° C. (840° F.). While in contact with the parts to be joined, the solder is melted and flows into the joint by capillary action. Upon cooling the molten solder, a permanent joint is formed between the parts. One common application of solders is in the electronics industry where solders are used to join electrical components. Solder may be supplied by a multicomponent paste that is deposited on the surface of at least one of the parts to be joined. Typically, the paste contains a flux and particles of a solder alloy. The flux is formulated to improve the soldering operation. For instance, fluxes are often formulated to remove surface contamination, like surface oxidation, from metallic parts. In that way, the flux may also improve the flow and wetting of the solder alloy across the metallic surface. In a soldering operation, once the solder paste is dispensed onto the surface, the solder paste is heated to a temperature where the flux prepares the surface. Upon further heating, the solder particles melt and flow across the prepared surface and into the joint, and following cooling, the solder forms the permanent joint.

Even though current solder pastes facilitate forming consistent, quality solder joints, there are difficulties with their use due to the pastes being temperature sensitive, in the sense that the pastes degrade or deteriorate when exposed to temperatures at or above room temperature prior to soldering. Specifically, with regard to temperature sensitivity, if the solder paste is exposed for prolonged periods at temperatures even as high as room temperature, it may gradually lose its beneficial attributes. Moreover, exposing the solder paste to greater temperatures hastens its deterioration. Consequently, current pastes are viewed as having a limited shelf life at and above room temperatures.

One solution to extend the shelf life of current pastes is to refrigerate them up to and including the time that the solder is deposited onto the parts to be joined. Refrigeration arrests or reduces chemical reactions from taking place within the paste and prevents the solder from separating from the flux prior to depositing. Typical refrigeration temperatures include temperatures generated by commercially available refrigeration or air conditioning equipment, such temperatures being generally below 10° C. However, refrigeration has significant drawbacks. Most notably, there are high capital and operational costs associated with using refrigeration equipment. Furthermore, more often than not, the nature of the manufacturing environment precludes refrigeration as a means for preventing degradation of the solder paste due to the elevated temperatures inherent in these environments or due to other factors including, for example, floor space within the manufacturing plant. Thus, solder pastes are not used in these environments because their beneficial attributes are limited or destroyed prior to the time that these benefits may be fully realized and because of the lack of a cost effective solution to these problems.

Another problem that limits or renders difficult the use of current solder pastes is that the solder paste remains soft or pasty following deposition. For example, problems arise when the solder paste is pre-deposited on the part but the actual soldering operation is performed at a later time and/or at another manufacturing facility. In the interim period between the deposition and the soldering operations, if the part is stored and/or handled, foreign objects may contact, rub against, or become stuck in the soft solder paste. In addition to the problems encountered due to foreign material being stuck to the paste, the paste may stick to the foreign object and adhere to that surface. This type of contact depletes the original deposit of paste, and, in extreme situations, the original deposit may be significantly depleted or even completely removed from the targeted surface. Additionally, the paste may inadvertently transfer to surfaces where the paste or solder alloy is detrimental to the part. In any event, the pasty, flowable nature of the paste at around room temperature limits its post-deposition operations and may add to the manufacturing costs. While refrigerating the solder paste may improve the shelf life of the solder paste, it may not result in the solder paste becoming non-pasty at these temperatures. In other words, a cold solder paste may have all of the above-mentioned inadvertent transfer issues. In addition to the cost considerations set forth above, refrigeration is not generally a solution to preserve the deposited solder pastes.

One solution that partially addresses transportation and handling problems includes immediate reflow of a dispensed paste with a subsequent application of flux to protect the reflowed solder alloy. During an initial reflow, the solder paste is fused at the predetermined, deposited locations. Following cleaning, the solder alloy is flattened by reheating the deposited, fused solder alloy and is then cooled. An outer coating of flux is applied to the flattened solder to prevent oxidation of the solder and promote later reflow of the solder. The flux-covered, reflowed solder alloy may then be transported or stored for later use. However, as noted, such a process requires that the part be heated at least one additional time which may be counterproductive since, in the case of electronic assemblies, the parts themselves may be temperature sensitive. The additional heating cycle may increase the number of component failures. Furthermore, the flux remains tacky such that a release sheet is attached to the flux to prevent contamination.

Consequently, there is a need for a solder flux and solder material that addresses the aforementioned problems. For example, what is needed is a flux and/or a solder material that is non-pasty at or near room temperature and at temperatures above these temperatures including normal manufacturing, storage, and shipping temperatures. Furthermore, what is needed is a solder flux and solder material that may be heated prior to deposition, that does not degrade at the deposition temperature, and that may be cooled and reheated without degrading.

SUMMARY OF THE INVENTION

To these ends, in one embodiment of the invention, a flux for use in soldering comprises a primary solids constituent that is present in an amount greater than about 50 wt. % and one or more secondary constituents that is selected from solvents, thickeners, and/or metal oxide reducing agents. The flux has a temperature profile in which the flux is in a non-flowable inactive state at temperatures at and below a maximum storage temperature that is above about 27° C., a liquid active state at an activation temperature, and a flowable inactive state in a deposition temperature range above the maximum storage temperature and below the activation temperature. In one embodiment, a solder material comprises solder particles that are dispersed in the flux. The solder particles are in a liquid state at or above the activation temperature.

In another embodiment, a method of making a solder material comprises heating the flux to a temperature within or above the deposition temperature range and below the activation temperature. The method further comprises dispersing solder particles throughout the heated flux to form a solder/flux mixture and cooling the solder/flux mixture to a temperature at or below the maximum storage temperature whereby the solder/flux mixture is in the non-flowable inactive state.

In another embodiment of the invention, a method of dispensing the solder material comprises heating the solder material to a temperature within or above the deposition temperature range and below the activation temperature. While the solder material is within or above the deposition temperature range and below the activation temperature, the method further comprises dispensing the heated solder material onto a substrate and cooling the solder material to a temperature at or below the maximum storage temperature whereby the solder material is in the non-flowable inactive state.

In another embodiment, a method of soldering with the solder material comprises heating the solder material to a temperature within or above the deposition temperature range and below the activation temperature. While the solder material is within or above the deposition temperature range and below the activation temperature, the method further comprises dispensing the heated solder material onto a work piece. The method further comprises heating the solder material to or above the activation temperature whereby the flux removes oxides from the surface of the work piece; heating the solder material to a melting temperature of the solder particles to melt the solder particles while in contact with the surface of the work piece; and cooling the melted solder.

In another embodiment, a method of soldering with the solder material comprises heating the solder material from a temperature at or below the maximum storage temperature to a melting temperature of the solder particles to melt the solder particles. The solder material is positioned between and in contact with each of a first work piece and a second work piece. The method further comprises cooling the melted solder whereby a joint is formed between the first and the second work pieces.

BRIEF DESCRIPTION THE DRAWING

The accompanying drawing, which is incorporated in and constitutes a part of this specification, illustrates embodiments of the invention and together with the detailed description given below, serves to explain various aspects of the invention.

FIG. 1 is a temperature-viscosity/hardness graph depicting three temperature profiles for three exemplary embodiments of the invention.

DETAILED DESCRIPTION

The present invention provides a solder flux for use in a soldering process. In one embodiment, the flux is mixed with particles of a solder alloy to form a soldering material. As set forth in more detail below, the flux comprises a primary solids constituent present in an amount greater than about 50 wt. % and one or more secondary constituents selected from solvents, thickeners, and/or metal oxide reducing agents.

In accordance with one embodiment of the present invention, the primary solids constituent, the secondary constituents, and/or the solder particles are selected to establish a specific temperature-viscosity/hardness relationship or profile that describes the viscosity of the flux over a range of temperatures. Specifically, the primary and secondary constituents may be selected to establish a temperature profile in order to predetermine the viscosity of the flux at a maximum storage temperature, the viscosity of the flux at a temperature in a deposition temperature range, and the temperature at which the flux is active, each of which is more fully described below.

In particular, as shown in FIG. 1, in embodiments of the present invention, the flux is characterized by a temperature profile that describes a relationship between the temperature of the flux and the viscosity/hardness of the flux (i.e., the x-axis and y-axis, respectively). It will be appreciated that the temperature-viscosity/hardness relationship applies to the flux whether alone or mixed with the solder alloy (i.e., the solder material). Therefore, unless specifically noted herein, reference to the properties of the flux includes the flux or the solder material (i.e., the flux plus the solder alloy). FIG. 1 depicts three different exemplary temperature profiles (labeled 10, 12, and 14) each of which describes the viscosity-temperature relationship for an exemplary flux. In general, and with reference the exemplary temperature profiles 10, 12, and 14, the viscosity/hardness of the each of the fluxes decreases with increasing temperatures. The viscosity/hardness of the flux is an indication of the flowability of the flux, with the flowability of the flux increasing with decreasing viscosity. Therefore, the temperature profile provides information regarding the flowability of the flux, by virtue of the viscosity/hardness, at temperatures encountered by the flux up to an activation temperature. By way of example and in order to more fully explain the relationship of the viscosity/hardness of the flux with the temperature of the flux, each of the exemplary temperature profiles 10, 12, and 14, is partially described by a maximum storage temperature $T_{S1}$, $T_{S2}$, and $T_{S3}$; a deposition temperature range $\Delta T_1$, $\Delta T_2$, and $\Delta T_3$; and an activation temperature $T_{A1}$, $T_{A2}$, and $T_{A3}$, at or above which the flux is active and below which the flux is inactive, respectively.

The maximum storage temperature, e.g. $T_{S1}$, $T_{S2}$, and $T_{S3}$, represents the highest temperature that the respective flux may tolerate and remain in a non-flowable state. As shown, the viscosity of each of the fluxes up to and including the maximum storage temperature $T_{S1}$, $T_{S2}$, and $T_{S3}$ of the respective flux is relatively high. At these viscosities, the flux is non-flowable. That is, the flux is not conducive to being dispensed, pumped, or applied to a surface while the temperature of the flux is at a temperature at or below the maximum storage temperature. In addition, the flux may not be sticky or tacky. However, the composition of the flux may be adjusted, as set forth in more detail below, such that the flux has a predetermined tackiness in the non-flowable state. It will be appreciated that the predetermined tackiness may depend on the application for which the flux is designed to be used.

While the flux may be non-flowable when exposed to temperatures that are at or below the maximum storage temperature, heating the flux to temperatures above the maximum storage temperature reduces the viscosity/hardness of the flux. In other words, the flux becomes softer and more flowable at temperatures above the maximum storage temperature. Upon further heating, the temperature of the flux reaches the lower temperature of the deposition temperature range. From the lower end to the higher end of the deposition temperature range, the flux is flowable and is inactive. In other words, when the flux temperature is in the deposition temperature range, the viscosity of the flux is low enough to allow the flux to be dispensed. As shown, the deposition temperature range may vary according to the particular flux formulation. Furthermore, the deposition temperature range may include temperatures that are above the maximum storage temperature and that are below the activation temperature of the flux. Dispensing the flux while the flux is in the flowable state may include forcing the heated flux through an orifice that may be heated. In one embodiment, the flux is dispensable with commercially available dispensing equipment, for example, DEK International stenciling equipment. By way of example, the deposition temperature range may include temperatures in the range of about 45° C. to about 100° C.

Further heating of the flux toward the higher end of the deposition temperature range may further reduce the viscosity of the flux. The viscosity of the flux may be reduced to a point where the flux flows under the influence of gravity, and upon further heating, the viscosity may decrease to the point where the flux is in a liquid state. In one embodiment, the highest temperature in the deposition temperature range may be slightly less than the activation temperature of the flux. However, it will be appreciated that there may be a range of temperatures between the highest deposition temperature and the activation temperature where the flux is too liquid to deposit and yet is not active. For example, where the solder particles are mixed with the flux (i.e., the solder material), the viscosity of the flux may decrease to a point where the particles settle or separate from the flux. Consequently, while the flux may be flowable and inactive at these temperatures, dispensing the solder material may be impractical where the solder particles cannot remain suspended in the flux. Thus, a practical upper limit to the deposition temperature range may be a temperature where the viscosity of the flux is reduced to a point where solder particles separate from the flux at a rate which negatively affects the quality of the solder paste deposit formed therefrom. However, one of ordinary skill will observe that the settling rate of the solder particles from the liquid flux may be influenced by the individual size of each solder particle as well as the density of the solder particles. In addition, the constituents of the flux, as set forth below, may be altered to promote and maintain the solder particles in suspension. Therefore, the practical upper limit temperature of the deposition temperature range of the solder material may be affected by changes in the solder particles and by changes to the constituents of the flux.

At temperatures above the deposition temperature range, the viscosity of the flux may continue to decrease. In particular, with further heating, the viscosity of the flux may be low enough to be considered a liquid. As shown, the flux may transition from having a pasty-like viscosity to having more of a liquid-like viscosity. In addition, in this temperature range, the viscosity may decrease at an increasing rate with further increases in the temperature. As the temperature of the flux is further increased, the viscosity may decrease though at a decreasing rate until the viscosity reaches a nearly constant value with increasing temperature, as shown in FIG. 1.

With reference to temperature profiles 10, 12, and 14 in FIG. 1, when the temperature of the respective flux reaches the respective activation temperature $T_{A1}$, $T_{A2}$, and $T_{A3}$, the viscosity of the flux may be relatively low such that the flux may be considered to be in a liquid state. Therefore, at the activation temperature, e.g. $T_{A1}$, $T_{A2}$, and $T_{A3}$, the flux may readily flow across the deposition surface. In addition, when the flux reaches the activation temperature, the flux becomes active. In the active state, the flux may be reactive with the surface on which it is dispensed and/or the constituents of the flux may react with one another. By contrast, below the activation temperatures $T_{A1}$, $T_{A2}$, and $T_{A3}$, the respective fluxes are in the inactive state. Thus, the flux may not react with the surface on which it resides nor do the flux constituents react with one another. Therefore, taking into account the liquid active state of the flux, upon reaching the activation temperature, the flux may flow across the surface while chemically reacting with any contaminates, like oxides, to prepare the surface for soldering. By way of example, the activation temperature may be at least about 50° C. In one embodiment, the activation temperature is above about 120° C.

At a temperature higher than the activation temperature, the viscosity of the flux may further decrease and any particles of solder melt. However, as shown in FIG. 1, the viscosity of the flux may only slightly decrease or may not decrease at all at temperatures above the activation temperature. In this case, the viscosity of the flux may become constant, or nearly so, as the temperature of the flux approaches and then exceeds the activation temperature. Furthermore, for some fluxes, the viscosity of the flux may reach a minimum value at temperatures below the activation temperature. It will be appreciated that the minimum viscosity of any particular flux may be different from the minimum viscosity observed for a different flux. In one embodiment, the temperature-viscosity curve of the flux may become asymptotic with the temperature axis in a temperature range that includes the activation temperature.

At a temperature above the activation temperature, the solder particles may melt. Once the solder particles melt, the flux may additionally promote wetting between the molten solder and the surfaces of the parts to promote the formation of a quality solder joint. The flux may also limit the reaction of the molten solder with the ambient environment. The temperature required to melt the solder particles (not labeled in FIG. 1) depends on the solder and is at least as high as the activation temperature, though the melting temperature of the solder is usually higher than the activation temperature. For example, the melting temperature may be in excess of about 150° C. and is typically in the range of about 185° C. to about 280° C. As previously mentioned, the liquidus temperature (i.e. the lowest temperature at which the solder alloy is completely liquid) must be at or below 450° C. to qualify as a solder material. Following melting of the solder and upon cooling, the solder forms a permanent solder joint.

In particular and with reference to temperature profile 10 in FIG. 1, the flux is characterized by a high viscosity at temperatures up to and including the maximum storage temperature, $T_{S1}$. More specifically, the flux represented by the temperature profile 10 is solid when the flux is at any temperature up to the maximum storage temperature $T_{S1}$. By way of example, the viscosity of the flux may exceed $10^{12}$ Pa·s when the flux is solid. Furthermore, in one embodiment, when the temperature of the flux is at or below the maximum storage temperate $T_{S1}$, the flux is hard or firm, though the flux composition may be formulated such that the flux has a maximum amount of tackiness as the specific application requires.

With continued reference to the flux represented by temperature profile 10, the flux may be formulated to set the maximum storage temperature $T_{S1}$ at or slightly above the range of temperatures that the flux may experience during shipping and warehousing (shown by arrow 16). As is known, many products experience a wide range of temperatures during shipping and warehousing because these temperatures are often uncontrolled, and depending on geography and other factors, may be in excess of temperatures experienced by the flux in all other environments. In one embodiment, for example, in the flux represented by the temperature profile 10, the flux is in the non-flowable inactive state in the shipping and warehousing environments because the maximum storage temperature $T_{s1}$ is slightly higher than the extreme temperatures that may be found in these environments. Consequently, where the maximum storage temperature of the flux exceeds the maximum temperature reached during transportation and warehousing, the flux may be shipped to geographical locations, for example, locations near the equator or when seasonal temperatures are relatively high, without concern that the flux will degrade or deteriorate prior to use. By way of example, temperatures observed during shipment and warehousing may exceed about 45° C. and in some cases may reach 50° C. or even 60° C.

Above the maximum storage temperature $T_{S1}$, the viscosity decreases with increasing temperature and the flux represented by temperature profile 10 enters into a flowable inactive state in which deposition of the solder material is possible, and advantageously, practical. In the case of temperature profile 10, the deposition temperature range $\Delta T_1$ is shown to be entirely within the pasty range of the material, although other embodiments will contemplate deposition in a liquid range of the material as well. The practical temperature range for deposition will depend on the method of deposition, the type of dispensing apparatus, the composition of the solder material, and other factors as may be appreciated by person of ordinary skill in the art. By way of example, $\Delta T_1$ may be about 70° C. to about 90° C., or about 75° C. to about 105° C., or about 90° C. to about 120° C.

Above the deposition temperature range $\Delta T_1$, and in the liquid viscosity range of the material, the flux reaches a liquid active state at the activation temperature $T_{A1}$. At $T_{A1}$ and above, the flux is chemically active and the function of surface preparation and wetting is initiated. By way of example, the $T_{A1}$ may be above about 100° C., or above about 120° C. By way of further example, $T_{A1}$ may be above about 120° C. and below the melting temperature of the solder alloy. As may be appreciated, for a flux with temperature profile 10, the selection of the flux components and the solder alloy would be aimed at providing relatively high activation and melting temperatures to accommodate the high maximum storage temperature needed for the anticipated shipping and warehousing conditions.

While the term "non-flowable" may refer to a solid flux, as described above, the invention is not so limited. The flux may have a paste-like consistency (i.e. lie in a pasty range of viscosities as is labeled in FIG. 1) and may still be considered to be non-flowable. For example, each of the fluxes represented by temperature profiles 12 and 14 are non-flowable at and below the respective maximum storage temperature $T_{S2}$ and $T_{S3}$ because the viscosities of the fluxes are sufficiently high to prevent the fluxes from being dispensed when subject to normal forces encountered in solder paste dispensing or due to gravity. Further, similar to the flux represented by temperature profile 10, the fluxes represented by temperature profiles 12 and 14 may be non-tacky or non-sticky up to and including the respective maximum storage temperature $T_{S2}$, $T_{S3}$ even though the viscosity of the respective flux lies in the pasty range.

With continued reference to FIG. 1, and with specific reference to temperature profile 12, the maximum storage temperature may be set to $T_{S2}$, which is less than $T_{S1}$. However, the maximum storage temperature $T_{S2}$ is greater than the temperatures experienced by the flux in, for example, a manufacturing environment where the temperature is uncontrolled (as shown by arrow 18). As is known in the art, the temperature in manufacturing environments may vary widely depending on numerous factors including geographical location, the time of year, and the type of operations being performed. By way of example, the temperature of a manufacturing environment may range from below room temperature to temperatures in excess of about 40° C. However, uncontrolled manufacturing environment temperatures may be lower than those encountered during shipping and warehousing, described above. Accordingly, in one embodiment, for example, the flux represented by temperature profile 12, the flux is in the non-flowable inactive state in the manufacturing environment because the maximum storage temperature $T_{S2}$ is at or slightly greater than the maximum temperature that is experienced by the flux in that environment.

Additionally, as provided by FIG. 1, the flux represented by the temperature profile 10 would also be in the non-flowable inactive state in a manufacturing environment, because $T_{S1}$ is also above the temperatures found in the manufacturing environment. The flux represented by the temperature profile 10 may be stored in the manufacturing environment, for example, in the vicinity of soldering equipment without concern that the flux will degrade or deteriorate prematurely, but may not perform as well as the flux represented by the temperature profile 12 because of the differences in the formulation between the two different fluxes. The flux represented by the temperature profile 12 may be specifically formulated for that particular manufacturing environment. As may be appreciated, the flux components and solder alloy for a solder material having a flux with temperature profile 12 could be selected to provide lower deposition and activation temperatures than required for the temperature profile 10 because the necessary maximum storage temperature is lower. Thus, by adjusting the formulation of the flux for a specific maximum storage temperature, deposition temperature range, and activation temperature, the shelf life may be extended indefinitely or at least prolonged while the viscosity and other properties of the flux may be formulated for a particular depositing technique and/or optimized for a particular application.

With further reference to temperature profile 12, above the maximum storage temperature $T_{S2}$, the deposition temperature range $\Delta T_2$ is shown to extend between the lower viscosity portion of the pasty range and the higher viscosity portion of the liquid range. Between $\Delta T_2$ and $T_{A2}$, it may be the case that the solder particles begin to separate out, such that the viscosity of the flux is too low to maintain the solder in suspension thereby making deposition impractical. In any event, for a maximum storage temperature $T_{S2}$ set to accommodate an uncontrolled manufacturing environment, $\Delta T_2$ may, for example, be about 45° C. to about 100° C., and by further example, may be about 50° C. to about 75° C. The activation temperature $T_{A2}$ may, for example, be greater than about 100° C., or greater than about 120° C., and below the melting temperature of the solder alloy.

Similarly, with reference to the flux represented by temperature profile 14, in one embodiment, the flux is formulated such that the maximum storage temperature $T_{S3}$ is slightly greater than room temperature or the temperature of a temperature controlled room (shown by arrow 20). The temperature controlled room may be held at a temperature by commercially available heating and air conditioning equipment. The temperature may be comfortable for an operator and/or to keep electronic devices in the room cool. These room and/or controlled temperatures may include temperatures in the range of from about 16° C. to about 27° C. By way of example, the maximum storage temperature may be about 30° C. Again, by formulating the flux to establish the desired temperature profile, as described above, the shelf life may be prolonged while the viscosity and other properties of the flux may be formulated for a particular depositing technique and/or optimized for a particular application. Accordingly, while the fluxes represented by the temperature profiles 10 and 12 may be stored at temperatures slightly greater than the temperature of the temperature controlled room where each remains in a non-flowable inactive state, the flux according to temperature profile 14 may be formulated specifically for that environment such that it may be deposited and activated at predetermined temperatures that would not allow the fluxes represented by the temperature profiles 10 and 12 to be deposited or activated. By way of example, the deposition temperature range $\Delta T_3$, shown to extend from the end of the pasty range to the high viscosity portion of the liquid range, may be about 35° C. to about 45° C., about 40° C. to about 55° C., or about 45° C. to about 60° C. The activation temperature $T_{A3}$ could be as low as about 50° C., and by way of example may be greater than about 100° C., or greater than about 150° C., and below the melting temperature of the solder alloy.

In addition, with reference to the temperature profiles 10, 12, 14 depicted in FIG. 1 and taking into account the inactive and active states described above, the portion of each temperature profile 10, 12, 14 up to a temperature that is slightly less than the activation temperature is reversible. In other words, the flux may be repeatedly heated and cooled between any two temperatures that are below the activation temperature $T_{A1}$, $T_{A2}$, and $T_{A3}$, respectively (i.e., while the flux is in the inactive state) to change the viscosity of the flux. The reversible nature of the temperature-viscosity/hardness profile up to the activation temperature is advantageous. By way of example, the flux may be heated to a temperature within the deposition temperature range, dispensed or deposited onto a surface of a part, cooled to a non-flowable inactive state, and then re-heated and re-flowed as many times as needed without significant degradation of the flux. Then, at some time following any reheating, the flux may then be heated to the activation temperature and later soldered.

In addition to the reversible nature of the temperature profile, the non-flowable nature of the flux up to at least the maximum storage temperature is advantageous. As set forth above, at temperatures at and below the maximum storage temperature, the dispensed flux may not have the pasty and/or softness problems associated with traditional dispensed solder paste. Therefore, the flux is less likely to be unintentionally transferred to other surfaces following dispensing and cooling. For example, the flux may be dispensed on to a work piece. Once the flux is cooled to below the maximum storage temperature, the work piece may be shipped and handled without contaminating the flux and without inadvertent removal of the flux therefrom. The work piece may be a circuit board, wires, copper pipe, or another substrate. Using the copper pipe as a specific example, the solder material may be pre-applied to the pipe in an optimum amount and in the optimum location. Once the flux is cooled to below the maximum storage temperature of the flux, the pipe may be stored, shipped, and later sold. During subsequent shipping and handling, the flux remains intact and in position. The purchaser may simply reheat the pre-applied solder material to above the activation temperature and the melting temperature of the solder to form a joint with another pipe or fitting. This type of process may provide more consistent, higher quality joints and may allow someone with less skill to form a quality joint.

In another embodiment, the work piece may be a circuit board. As is known in the art, in many cases the copper connections on a circuit board are plated with gold, silver, or other expensive alloys, in order to reduce oxidation. According to embodiments of the present invention, these expensive alloys would not be needed because the solder material could be applied in place of the alloys. The flux may be hydrophobic and thus form a hydrophobic barrier that protects the surface from oxidation and other corrosion-type reactions. The board with the solder material may then be transported to another location without significant loss of the flux or oxidation of the electrical contacts. This would also eliminate the need for later solder paste printing onto circuit boards. In addition, by using the flux, the board would only be heated for the final joining, which would reduce the number of times that the board is exposed to high temperatures. As is known in the art, the more times that an electrical component, like a circuit board, is heated, the greater the chance that it will fail prematurely during use.

In one embodiment, the flux may be dispensed by forcing the flux through an orifice at a temperature within the deposition temperature range. In general, in addition to stenciling systems that are currently utilized to dispense the flux pastes, it is believed that traditional hot-melt dispensing methods and/or products could also be used to dispense the flux because these systems control the deposition temperature. For example, a cartridge dispensing system could be used. An example of such a system is described in U.S. Pat. No. 5,435,462, the disclosure of which is incorporated by reference herein in its entirety. Accordingly, a cartridge containing the flux or solder material may be inserted into a heated cavity in this system.

Alternatively, the flux or solder material could also be placed in bulk containers, such as 5-gallon pails or 55-gallon drums. The pail or drum may be placed on a heated platen or other warming devices to heat the flux to a temperature within the deposition temperature range such that large quantities of the flux may be deposited from a single source. In another embodiment, a slug melter could be used. In this case, a preformed rod or other preformed shape of the solder material could be inserted into the slug melter and a plunger-like device could be used to heat and force the material onto a work piece. In yet another embodiment, the flux may be printed onto a substrate with a heated printing system that maintains the stencil or screen at a selected temperature within the deposition temperature range. The substrate may also be heated. In yet another embodiment, deposition may include dipping a part into a reservoir of the flux held at the deposition temperature. The part may be the targeted part or the part may be used to transfer a predetermined quantity of the flux to the targeted part. Other similar suitable systems may be used to heat and dispense the flux.

As introduced above, the flux comprises a primary solids constituent in an amount greater than about 50 wt. % and one or more secondary constituents selected from solvents, thickeners, and/or metal oxide reducing agents, for instance, an acid. The proportions of the primary solids constituent and one or more secondary constituents are selected to provide the desired temperature profile, described above. For example, in preparing the flux, the primary solids constituent and secondary constituents may be selected based on the maximum storage temperature needed to store, handle, or transport the flux; the desired deposition temperature range; the desired activation temperature; and the function of the flux upon activation.

In one embodiment, the primary solids constituent comprises a rosin, a resin, or a wax or a combination or mixture thereof. Additional primary solids may include polyglycols, cocamides, and other suitable compounds. The primary solids constituent holds the flux and any solder particles together, and may include one or more compounds that collectively make up greater than 50 wt. % of the flux. Thus "constituent" should not be interpreted as strictly singular. The primary solids constituent may have a softening point greater than about 50° C. Generally, the higher the softening temperature of the primary solids constituent, the higher the maximum storage temperature and the higher the deposition temperature range. By way of additional example, the softening point may be at least about 80° C. The rosin may be, for example, a natural rosin, such as water white rosin. Other rosins, such as hydrogenated wood rosin, tall oil rosin, gum rosin and disproportionate wood rosin or mixtures thereof may be mixed with the secondary constituents to provide the desired temperature profile, as described above. Suitable commercially available rosins include Dymerex™ sold by Eastman or Nuroz™ sold by Newport Industries Ltd.

The resin may be obtained by modifying one or more of the rosins described above by combining the resin with an unsaturated organic acid. Examples of suitable, commercially available resins include Staybelite®, sold by Ashland, and Poly-Pale™ sold by Eastman. Examples of waxes suitable for use include microcrystalline waxes, naphthenic waxes, and/ or paraffin waxes, among others. Suitable commercially available waxes include CM 7010 W and other CM series waxes sold by Caromax International.

In one embodiment, the one or more secondary constituents may be used to adjust the temperature profile of the flux in order to account for the temperatures that are expected during shipping and warehousing and/or within the manufacturing environment, as set forth above. Additionally, the secondary constituents may, among other criteria, be selected and proportioned to adjust the deposition temperature range and the activation temperature, as well as the specific reaction with the targeted surface. By way of example, the secondary constituent may be one or more solvents, such as mineral spirits and thickeners. Further, the secondary constituent may include an acid or mixture of acids. Suitable acids may include weak acids, and more particularly weak organic acids, such as a carboxylic acid, for example, stearic acid and/or azelaic acid. In one embodiment, the flux includes an activator to clean the surface by removing oxides and other contaminants. The activator may be a weak organic acid, a halogenated compound, an amine, or other metal oxide reducing agent. Furthermore, the activator may be selected based on the type of surface on which the flux is to be dispensed. Other suitable secondary constituents include oil, alcohol, and/or a glycol, like polyethylene glycol. The flux optionally includes other secondary constituents, such as a surface tension modifying agent or surfactant, which reduces or eliminates solder ball production when the flux is mixed with solder particles and is used to form a solder joint.

In one embodiment, the flux may include a 2:1 ratio of hydrogenated rosin with a softening point of approximately 70° C. to 1-Octadecanol. This mixture may further include a weak organic acid in a quantity appropriate to reduce oxides during reflow. The flux may also include a thixotrope to adjust the deposition temperature range to include a temperature of 40° C. Solder particles may be dispersed within the flux and mineral spirits may be added to adjust the deposition temperature range.

In one embodiment, the solder particles that are mixed with the flux may comprise tin (Sn), lead (Pb), silver (Ag), bismuth (Bi), copper (Cu), antimony (Sb), Indium (In), Zinc (Zn), or Nickel (Ni), or alloys or combinations thereof as is appropriate for the application. Alloys of various combinations of the above-mentioned elements may each have a specific application. However, widely used solder alloys include, for example, Sn—Pb alloys like 60Sn-40Pb and 63Sn-37Pb. However, "lead-free" soldering alloys, for instance, Sn—Cu, Sn—Ag, and Sn—Sb alloy-based solders, are known in the art.

In order to facilitate a more complete understanding of the invention, the following non-limiting example is provided.

Example

A flux that is solid at room temperature was prepared. The flux contained 80 wt. % partially hydrogenated rosin having a softening temperature of approximately 80° C. and an acid value of 150-170, 15 wt. % polyethylene glycol 1450, 2.5 wt. % azelaic acid, and 2.5 wt. % stearic acid.

A solder material was prepared by dispersing solder particles in the above flux. The solder material contained 85 wt. % solder particles of 96.5Sn-3Ag-0.5Cu alloy with the above flux forming the balance of the solder material. At 22° C., the solder material was solid. The deposition temperature range was roughly 45° C. to 60° C. The activation temperature was approximately 95° C.

In another embodiment, a method of making the flux includes heating the primary solids constituent to a liquid state. While the primary solids constituent is in the liquid state, the one or more secondary constituents are added to form a flux mixture. The flux mixture is cooled to a temperature at or below the maximum storage temperature where the flux mixture is in the non-flowable inactive state.

In one embodiment of the invention, the solder material may be made by heating the flux to a temperature within or above the deposition temperature range and below the activation temperature. While the flux is in the flowable inactive state, the solder particles are dispersed throughout the heated flux to form a solder/flux mixture. The solder/flux mixture is allowed to cool to a temperature at or below the maximum storage temperature whereby the solder/flux mixture is in the non-flowable inactive state.

While the present invention has been illustrated by a description of various embodiments and while these embodiments have been described in some detail, it is not the intention of the Applicant to restrict or in any way limit the scope of the appended claims to such detail. Additional advantages and modifications will readily appear to those of ordinary skill in the art. The various features of the invention may be used alone or in numerous combinations depending on the needs and preferences of the user.

What is claimed is:

1. A solder material comprising:
   a solder/flux mixture of solder particles dispersed in a flux, wherein the solder/flux mixture is a solid at room temperature;
   solder particles are made of a lead-free soldering alloy, wherein the lead-free soldering alloy is a tin-silver-copper alloy;
   the flux comprises a primary solids constituent present in an amount greater than about 50 wt. % and one or more secondary constituents selected from solvents, thickeners, and metal oxide reducing agents, wherein the flux includes a polyglycol;
   the flux has a temperature profile in which the flux is in a non-flowable inactive state at temperatures at and below a maximum storage temperature, a liquid active state at an activation temperature, and a flowable inactive state in a deposition temperature range above the maximum storage temperature and below the activation temperature, the maximum storage temperature being above about 27° C.; and the solder particles are in a liquid state at or above the activation temperature.

2. A method of making the solder material of claim 1, comprising:

heating the flux to a temperature within or above the deposition temperature range and below the activation temperature;

dispersing solder particles throughout the heated flux to form the solder/flux mixture; and cooling the solder/flux mixture to room temperature whereby the solder/flux mixture is a solid.

3. A method of dispensing the solder material of claim 1 comprising:

heating the solder material to a temperature within or above the deposition temperature range and below the activation temperature;

while the solder material is within or above the deposition temperature range and below the activation temperature, dispensing the heated solder material onto a substrate; and cooling the solder material to a temperature at or below the maximum storage temperature whereby the solder material is in the non-flowable inactive state.

4. The method of claim 3 wherein dispensing includes forcing the heated solder material through an orifice.

5. The method of claim 3 wherein prior to heating the solder material, the method further comprises:

storing the solder material at or below the maximum storage temperature whereby the solder material is in the non-flowable inactive state.

6. A method of soldering with the solder material of claim 1 comprising:

heating the solder material to a temperature within or above the deposition temperature range and below the activation temperature;

while the temperature of the solder material is within or above the deposition temperature range and below the activation temperature, dispensing the heated solder material onto a work piece;

heating the solder material to or above the activation temperature whereby the flux removes oxides from the surface of the work piece;

heating the solder material to a melting temperature of the solder particles to melt the solder particles while in contact with the surface of the work piece; and cooling a melted solder.

7. The method of claim 6 wherein dispensing includes forcing the heated solder material through an orifice.

8. A method of soldering with the solder material of claim 1 comprising:

heating the solder material from a temperature at or below the maximum storage temperature to a melting temperature of the solder particles to melt the solder particles, the solder material being positioned between and in contact with each of a first work piece and a second work piece; and cooling a melted solder whereby a joint is formed between the first and the second work pieces.

9. The method of claim 8 wherein the first work piece is one of a copper pipe or metallic fitting, an electrical component, or a wire.

10. A method of making the solder material of claim 1, comprising:

heating the primary solids constituent to a liquid state;

adding the one or more secondary constituents to the primary solids constituent while in the liquid state to form a flux mixture that is in the flowable inactive state;

dispersing solder particles throughout the heated flux mixture to form the solder/flux mixture; and cooling the solder/flux mixture to room temperature whereby the solder/flux mixture is a solid.

11. An apparatus comprising:

a substrate; and a layer consisting of the solder material of claim 1 attached to the substrate.

12. The apparatus of claim 11 wherein the substrate is one of a copper pipe or metallic fitting, an electrical component, or a wire.

13. The solder material of claim 1 wherein the flux further includes a rosin.

14. The solder material of claim 1 wherein the primary solids constituent has a softening point greater than about 50° C.

15. The solder material of claim 1 wherein the maximum storage temperature is about 40° C.

16. The solder material of claim 15 wherein the deposition temperature range includes temperatures in the range of about 45° C. to about 100° C.

17. The solder material of claim 16 wherein the activation temperature is greater than about 120° C.

18. The solder material of claim 1 wherein the non-flowable inactive state is a solid state.

19. The solder material of claim 1 wherein the deposition temperature range includes temperatures in the range of about 75° C. to about 105° C. and the activation temperature is above the deposition temperature range.

20. The solder material of claim 1 wherein the deposition temperature range includes temperatures in the range of about 45° C. to about 60° C. and the activation temperature is above the deposition temperature range.

21. The solder material of claim 1 wherein the primary solids constituent comprises a rosin, a resin, or a wax or a combination thereof.

* * * * *